(12) United States Patent
Kalevo (10) Patent No.: US 8,754,791 B1
(45) Date of Patent: Jun. 17, 2014

(54) ENTROPY MODIFIER AND METHOD (71) Applicant: Gurulogic Microsystems Oy, Turku (FI)

(72) Inventor: Ossi Kalevo, Toijala (FI)

(73) Assignee: Gurulogic Microsystems Oy, Turku (FI)

( * ) Notice: Subject to any disclaimer, the term of this patent is extended or adjusted under 35 U.S.C. 154(b) by 0 days.

(21) Appl. No.: 13/782,757

(22) Filed: Mar. 1, 2013

(51) Int. Cl.
*H03M 7/00* (2006.01)

(52) U.S. Cl.
USPC ............................................. 341/50; 341/51

(58) Field of Classification Search
CPC .. H03M 7/30; H03M 7/4006; H04N 7/26106; H04N 7/50; G06K 9/38
USPC .............. 341/50, 51, 107; 382/232, 237, 246; 375/240.03
See application file for complete search history.

(56) References Cited

U.S. PATENT DOCUMENTS

| | | | |
|---|---|---|---|
| 5,471,207 A | * | 11/1995 | Zandi et al. .................. 341/107 |
| 2002/0193668 A1 | | 12/2002 | Munneke et al. |

FOREIGN PATENT DOCUMENTS

| | | |
|---|---|---|
| GB | 2 301 252 A | 11/1996 |
| WO | WO 2010/050157 A1 | 5/2010 |

OTHER PUBLICATIONS

Combined Search and Examination Report Under Sections 17 and 18(3) dated Aug. 22, 2013, issued by UKIPO in related U.K. Patent Application No. GB1303658.7 (6 pages).

\* cited by examiner

*Primary Examiner* — Joseph Lauture
(74) *Attorney, Agent, or Firm* — Robert P. Michal; Lucas & Mercanti LLP (57) ABSTRACT

There is provided an entropy modifier which is operable to encode, alternatively decode, a stream of input data bits having a first entropy for generating corresponding entropy-modified output data having a second entropy, wherein the entropy modifier is operable to process the stream of input data bits to handle groups of mutually similar bits and the value of the first bit, and one or more maximum run lengths of the groups of mutually similar bits. Optionally, the entropy modifier is operable to control one or more maximum run lengths of the groups of mutually similar bits by using at least one escape code.

60 Claims, 1 Drawing Sheet

ENTROPY MODIFIER AND METHOD

FIELD OF THE INVENTION

The present invention relates to entropy modifiers which are operable to receive input data and generate corresponding output data whose entropy has been modified relative to that of the input data, for example for purposes of data compression and/or data de-compression; the entropy modifiers are implementable using electronic hardware and/or software products stored on machine-readable data storage media and executable upon computing hardware. Moreover, the present invention also concerns methods of modifying entropy of input data to generate corresponding output data which has a modified degree of entropy relative to that of the input data. Furthermore, the present invention relates to software products recorded on machine-readable data storage media, wherein the software products are executable upon computing hardware for executing aforementioned methods. The entropy modifiers are useable, for example, as component parts of data communication systems and data supply systems, for example media supply systems.

BACKGROUND OF THE INVENTION

In overview, in information theory, entropy is a measure of an uncertainty in a random variable, and pertains to physical continuous systems, for example as in thermodynamics, as well as to information systems, for example data communication systems. Moreover, in the context of data communication systems, entropy is more appropriately referred to as being Shannon entropy; reference is made to Claude E. Shannon's 1948 scientific paper "*A Mathematical Theory of Communication*" which is hereby incorporated by reference Shannon entropy is useable for quantifying an expected value of information contained in a given message. Furthermore, Shannon entropy is expressible in terms of nats and bans, as well as bits.

Shannon entropy provides an absolute limit regarding a best possible lossless encoding or compression of any communication, assuming that a given communication is susceptible to being represented as a sequence of independent and identically-distributed random variables. Moreover, Shannon's theory has indentified that an average length L of a shortest possible representation to encode a given message in a given alphabet is their entropy E divided by a logarithm of a number of symbols N present in the alphabet, namely as defined in Equation 1 (Eq, 1):

$$L = \frac{E}{\log_{10} N} \qquad \text{Eq. 1}$$

Thus, the entropy E is a measure of unpredictability or information content. In a lossless data compression method, compressed output data generated by applying the method to corresponding input data has a similar quantity of information as the input data, but the output data includes fewer data bits relative to the input data. In consequence, the compressed output data is more unpredictable because it contains less redundancy of information therein.

Shannon's theory has been taken into account in the design of known data encoding apparatus. For example, in a published international patent application no. WO2010/050157A1 (PCT/JP2009/005548, "Image encoding apparatus, image encoding method, and image encoding program", Applicant—Thomson Licensing), there is described an image encoding apparatus, an image encoding method and an image encoding program, which are operable to homogenize image quality of an image as a whole without lowering encoding efficiency, and which are operable at high speed, and are capable of reducing the size of circuit scale by performing macroblock shuffling without changing slice structure. Moreover, there is also provided an image encoding apparatus, including:

(i) a shuffling portion which collects and shuffles a plurality of macroblocks constituting image data from respective positions within an image;

(ii) an encoding portion which performs spatial frequency transformations and entropy encoding on the plurality of macroblocks which are collected and shuffled by the shuffling portion; and (iii) a rate control portion which controls the encoding portion to adjust the rate of the plurality of macroblocks after encoding has been executed.

Data, irrespective of type of the data, require data storage space, and also bandwidth in communication network capacity when moved from one spatial location to another. Such bandwidth corresponds to investment of communication infrastructure and utilization of energy in reality. As volumes of data to be communicated are projected to increase in future, more data storage space and more communication system capacity will be needed, and often also more energy will be needed. In the contemporary Internet, there are stored huge quantities of data, often in multiple copies. Thus, any approach which is able to compress data, especially when such compression is lossless, is potentially of great technical and economic benefit. Contemporarily, there are several known methods for reducing entropy within data sets, for compressing the data sets. Moreover, there are known methods of modifying entropy present in data sets, for example Delta coding and Run-Length-Encoding (RLE), but new methods are still required which provide more effective data compression of data.

Thus, there are many different compression methods that are employable to compress given data by reducing entropy present in given data, for example aforesaid RLE coding, aforesaid VLC coding, Huffman coding, Delta coding and Arithmetic coding. These methods are typically designed to compress alphabets, numbers, bytes and words. However, such methods are not particularly suitable for compressing individual bits, and for this reason are not ideally suited for compressing data that can change in a bit-by-bit manner, for example streams of data bits.

In respect of conventional RLE coding, there is stored either a given value, namely bit, or two times the value, namely bit, and then a number of similar values, namely bits, after that. RLE can be applied selectively, for example, namely its coding can be reserved solely for coding runs including a known amount of bits for a number of similar values. Such selective application of RLE requires that the same value be put once or twice again into a given data stream with each new run. However, there is contemporarily required better approaches to data compression, which reduce entry in sets of data, independently of types of data.

SUMMARY OF THE INVENTION

A first object of the present invention is to provide an improved entropy modification, for example for providing improved compression of data.

A second object of the present invention is to provide an improved method of entropy modification, for example for providing improved compression of data.

According to a first aspect of the present invention, there is provided an entropy modifier as claimed in appended claim 1: there is provided an entropy modifier which is operable to encode a stream of input data bits (D1) having a first entropy for generating corresponding entropy-modified output data (D2) having a second entropy, wherein the entropy modifier is operable to process the stream of input data bits to handle groups of mutually similar bits and the value of the first bit, and one or more maximum run lengths of the groups of mutually similar bits.

The present invention is of advantage in that selective use of run length representation of the data is able to provide enhanced entropy modification, for example enhanced data compression.

Optionally, the entropy modifier is operable to control one or more maximum run lengths of the groups of mutually similar bits by using at least one escape code. More optionally, the entropy modifier is implemented such that the one or more maximum run lengths of the groups of mutually similar bits are controlled by a plurality of escape codes.

One kind of escape code solution employed uses a maximum run length value and an indication that the amount of similar bits is continued. In this kind of solution all the symbols can be coded as one data stream. The other kind of escape code enables utilization of many different solutions that are separated from the coded symbols and represents the continuous amount of similar bits value that is greater than the maximum run length value. This kind of solution can be handled as two separate streams or the solution can be designed so that any value representing the number is not bigger than the maximum run, such that they can also be coded with the same stream of other symbols. Also other escape methods are optionally employed.

Optionally, the entropy modifier is operable to handle the input stream of data (D1) using the maximum run length in manner which is dynamically varied as a function of a nature of the stream of input data (D1).

Optionally, the entropy modifier is operable to handle a value of a first bit in the stream of input data (D1) separately from a sequence of data bits. More optionally, the entropy modifier is operable to handle the value of the first bit as separately encoded relative to the sequence of data values that represent a continuous amount of similar bits.

Optionally, the entropy modifier is implemented such that the at least one escape code is implemented as a "0" value within the entropy modifier.

Optionally, the entropy modifier is utilized in conjunction with one or more coding arrangements for handling the stream of input data bits (D1), wherein the one or more coding arrangements include one or more of: ODelta coder, RLE coding, VLC coding, Huffman coding, Delta coding, Arithmetic coding.

Optionally, the entropy modifier is operable to handle the stream of input data bits (D1) in a plurality of parts which are separately encoded or decoded. More optionally, the entropy modifier is operable to handle the plurality of parts in a temporally parallel manner, namely by way of parallel execution. More optionally, the entropy modifier is operable to handle the plurality of parts by using maximum run lengths which are mutually different for one or more of the parts.

Optionally, the entropy modifier is implemented to function as an encoder for compressing the stream of input data (D1) to generate the entropy-modified output (D2, D3).

Optionally, the entropy modifier is operable to assist to transform a bit string present in the input data (D1) to symbols present in the entropy modified output data (D2).

Optionally, the entropy modifier includes computing hardware, wherein the computing hardware is operable to execute one or more software products recorded on machine-readable data storage media for processing the stream of input data (D1) to generate the output data (D2).

According to a second aspect of the invention, there is provided an entropy modifier which is operable to decode a stream of input data bits (D3 or D4) having a first entropy for generating corresponding entropy-modified output data (D5) having a second entropy, wherein the entropy modifier (60) is operable to process the stream of input data bits (D3 or D4) to handle groups of mutually similar bits and the value of the first bit, and one or more maximum run lengths of the groups of mutually similar bits.

Optionally, the entropy modifier is operable to process one or more maximum run lengths of the groups of mutually similar bits by using at least one escape code. More optionally, the entropy modifier is implemented such that the one or more maximum run lengths of the groups of mutually similar bits are processed by using a plurality of escape codes.

One kind of escape code solution employed uses a maximum run length value and an indication that the amount of similar bits is continued. In this kind of solution all the symbols can be coded as one data stream, similarly decoded a one data stream. The other kind of escape code enables utilization of many different solutions that are separated from the coded symbols and represents the continuous amount of similar bits value that is greater than the maximum run length value. This kind of solution can be handled as two separate streams or the solution can be designed so that any value representing the number is not bigger than the maximum run, such that they can also be coded with the same stream of other symbols. Also other escape methods are optionally employed.

Optionally, the entropy modifier is operable to handle the input stream of data (D3 or D4) using the maximum run length in manner which is dynamically varied as a function of a nature of the stream of input data (D3 or D4).

Optionally, the entropy modifier is operable to handle a value of a first bit in the stream of input data (D3 or D4) separately from a sequence of data bits. More optionally, the entropy modifier is operable to handle the value of the first bit as separately encoded relative to the sequence of data values that represent a continuous amount of similar bits. More optionally, the entropy modifier is implemented such that the at least one escape code is implemented as a "0" value within the entropy modifier.

Optionally, the entropy modifier is operable to decode data elements present in the input data (D3 or D4) and apply an inverse entropy modification to generate the output data (D5) as a decoded bit stream.

Optionally, the entropy modifier is utilized in conjunction with one or more coding arrangements for handling the stream of input data bits (D3), wherein the one or more coding arrangements include one or more of: ODelta coder, RLE coding, VLC coding, Huffman coding, Delta coding, Arithmetic coding.

Optionally, the entropy modifier is operable to handle the stream of input data bits (D3 or D4) in a plurality of parts which are separately encoded or decoded. More optionally, the entropy modifier is operable to handle the plurality of parts in a temporally parallel manner, namely by way of parallel execution. More optionally, the entropy modifier is operable to handle the plurality of parts by using maximum run lengths which are mutually different for one or more of the parts.

Optionally, the entropy modifier is implemented to function as a decoder for decompressing the stream of input data (D3 or D4) to generate the entropy-modified output (D5).

Optionally, the entropy modifier is operable to assist to transform symbols present in the input data (D3 or D4) to a bit string present in the output data (D05).

Optionally, the entropy modifier includes computing hardware, wherein the computing hardware is operable to execute one or more software products recorded on machine-readable data storage media for processing the stream of input data (D3 or D4) to generate the output data (D5).

According to a third aspect of the invention, there is provided a method of using an entropy modifier to encode a stream of input data bits (D1) having a first entropy for generating corresponding entropy-modified output data (D2) having a second entropy, wherein the method includes:

using the entropy modifier to process the stream of input data bits (D1) to handle groups of mutually similar bits and the value of the first bit, and one or more maximum run lengths of the groups of mutually similar bits.

Optionally, the method includes using the entropy modifier to control one or more maximum run lengths of the groups of mutually similar bits by using at least one escape code. More optionally, the method includes using a plurality of escape codes to control the one or more maximum run lengths of the groups of mutually similar bits. More optionally, the method includes using the entropy modifier to handle the input stream of data (D1) using the maximum run length in manner which is dynamically varied as a function of a nature of the stream of input data (D1).

Optionally, the method includes using the entropy modifier to handle a value of a first bit in the stream of input data (D1) separately from a sequence of data bits. More optionally, the method includes using the entropy modifier to handle the value of the first bit as separately encoded relative to the sequence of data values that represent a continuous amount of similar bits.

Optionally, the method is implemented such that the at least one escape code is implemented as a "0" value within the entropy modifier.

Optionally, the method includes using the entropy modifier in conjunction with one or more coding arrangements for handling the stream of input data bits (D1), wherein the one or more coding arrangements include one or more of: ODelta coder, RLE coding, VLC coding, Huffman coding, Delta coding, Arithmetic coding.

Optionally, the method includes using the entropy modifier to handle the stream of input data bits (D1) in a plurality of parts which are separately encoded or decoded.

Optionally, the method includes using the entropy modifier to handle the plurality of parts in a temporally parallel manner, namely by way of parallel execution.

Optionally, the method includes using the entropy modifier to handle the plurality of parts by using maximum run lengths which are mutually different for one or more of the parts.

Optionally, the method includes implementing the entropy modifier to function as an encoder for compressing the stream of input data (D1) to generate the entropy-modified output (D2, D3). More optionally, the method includes using the entropy modifier to assist to transform a bit string present in the input data (D1) to symbols present in the entropy modified output data (D2). More optionally, the method includes implementing the entropy modifier to include computing hardware, wherein the computing hardware is operable to execute one or more software products recorded on machine-readable data storage media for processing the stream of input data (D1) to generate the output data (D2).

According to a fourth aspect of the invention, there is provided a method of using an entropy modifier to decode a stream of input data bits (D3 or D4) having a first entropy for generating corresponding entropy-modified output data (D5) having a second entropy, wherein the method includes:

Using the entropy modifier to process the stream of input data bits (D3 or D4) to handle groups of mutually similar bits and the value of the first bit, and one or more maximum run lengths of the groups of mutually similar bits.

Optionally, the method includes using the entropy modifier to process one or more maximum run lengths of the groups of mutually similar bits by using at least one escape code. More optionally, the method includes processing the one or more maximum run lengths of the groups of mutually similar bits by using a plurality of escape codes.

Optionally, the method includes using the entropy modifier to handle the input stream of data (D3 or D4) using the maximum run length in manner which is dynamically varied as a function of a nature of the stream of input data (D3 or D4).

Optionally, the method includes using the entropy modifier to handle a value of a first bit in the stream of input data (D3 or D4) separately from a sequence of data bits.

More optionally, the method includes using the entropy modifier to handle the value of the first bit as separately encoded relative to the sequence of data values that represent a continuous amount of similar bits. More optionally, the method is implemented such that the at least one escape code is implemented as a "0" value within the entropy modifier.

Optionally, the method includes using the entropy modifier to decode data elements present in the input data (D3 or D4) and apply an inverse entropy modification to generate the output data (D5) as a decoded bit stream.

Optionally, the method includes using the entropy modifier in conjunction with one or more coding arrangements for handling the stream of input data bits (D3), wherein the one or more coding arrangements include one or more of: ODelta coder, RLE coding, VLC coding, Huffman coding, Delta coding, Arithmetic coding.

Optionally, the method includes using the entropy modifier to handle the stream of input data bits (D3 or D4) in a plurality of parts which are separately encoded or decoded. More optionally, the method includes using the entropy modifier to handle the plurality of parts in a temporally parallel manner, namely by way of parallel execution.

Optionally, the method includes using the entropy modifier to handle the plurality of parts by using maximum run lengths which are mutually different for one or more of the parts.

Optionally, the method includes using the entropy modifier to function as a decoder for decompressing the stream of input data (D3 or D4) to generate the entropy-modified output (D5).

Optionally, the method includes using the entropy modifier to assist to transform symbols present in the input data (D3 or D4) to a bit string present in the output data (D5).

Optionally, the method includes implementing the entropy modifier to computing hardware, wherein the computing hardware is operable to execute one or more software products recorded on machine-readable data storage media for processing the stream of input data (D3 or D4) to generate the output data (D5).

According to a fifth aspect of the invention, there is provided a software product recorded on machine-readable data storage media, wherein the software product is executable upon computing hardware for executing the method pursuant to the third aspect of the invention.

According to a sixth aspect of the invention, there is provided a software product recorded on machine-readable data storage media, wherein the software product is executable upon computing hardware for executing the method pursuant to the fourth aspect of the invention.

It will be appreciated that features of the invention are susceptible to being combined in various combinations without departing from the scope of the invention as defined by the appended claims.

DESCRIPTION OF THE DIAGRAMS

Embodiments of the present invention will now be described, by way of example only, with reference to the following diagram wherein.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS OF THE INVENTION

Figure 1:
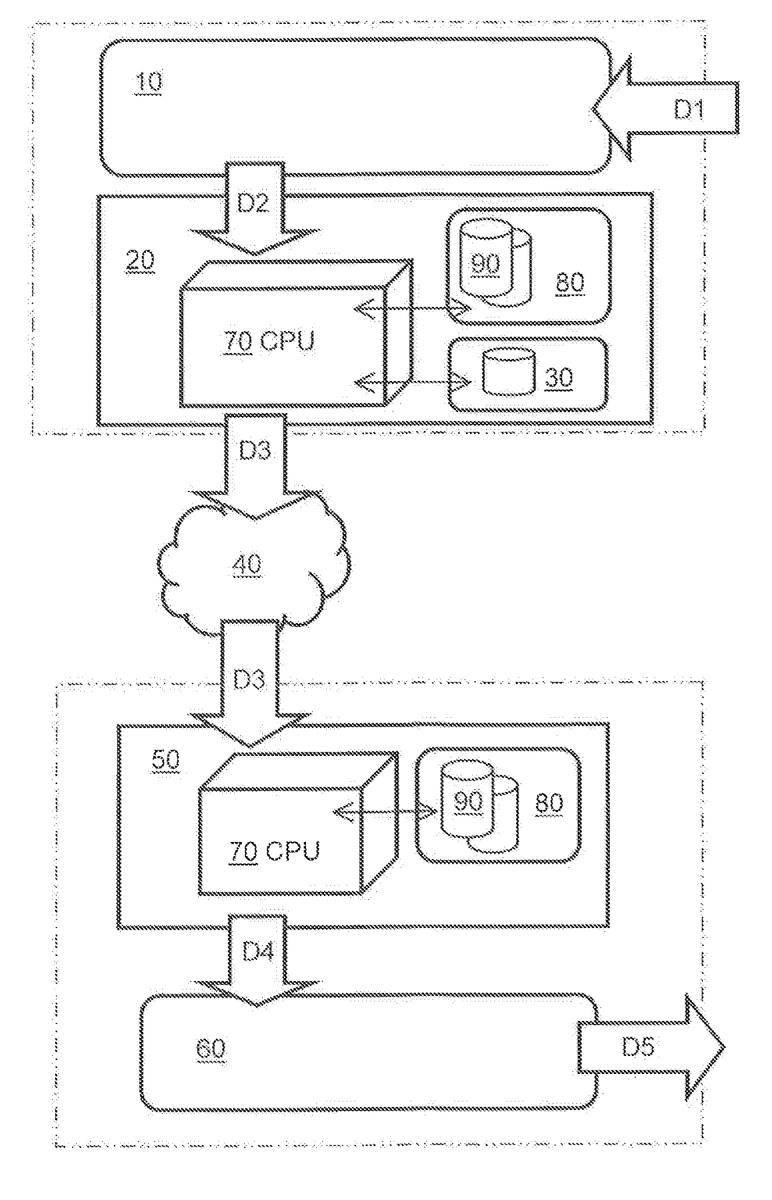
FIG. 1 is an illustration of a codec system including entropy modifiers pursuant to the present invention.

In overview, the present invention is concerned with an entropy modifier. Referring to FIG. 1, input data D1 is supplied to a first entropy modifier 10 which transforms the input data to generate corresponding transformed data D2; the data D2 is optionally mutually different in size relative to the data D1, depending upon a nature of transformation employed in the first entropy modifier 10, and has reduced entropy, relative to the data D2. Optionally, the data D2 is further coded via an encoding stage 20 to generate final encoded output data D3; when the encoding stage 20 is not employed, data D2 and D3 are mutually similar. The encoded output data D3 is stored in data memory 30 and/or transmitted via a data communication network 40. Moreover, the output data D3 is communicated directly to a second entropy modifier 60, or optionally via a decoding stage 50 to the second entropy modifier 60 when the aforesaid encoding stage 20 is employed such that data D4 is substantially similar to the data D2. The second entropy modifier 60 generates decoded output data D5 which is substantially similar to the input data D1. Thus, the first entropy modifier 10 and the second entropy modifier 60 perform mutually inverse entropy modifying operations, for example as in a codec configuration.

Optionally, the first and second entropy modifiers 10, 60 are operable to process data therethrough as a plurality of parallel streams of data for achieving faster entropy modification, for example faster encoding and/or decoding. Such faster processing using a plurality of parallel data streams is beneficial when handling large volumes of data, for example streamed video content from data servers, for example from Internet-based servers providing cable TV services.

The first entropy modifier 10 therefore consumes a stream of bits present in the data D1 and creates from them data elements whose entropy is reduced compared to the entropy of the input data D1. These modified data elements are optionally further encoded in the encoding stage 20 by employing methods such as Variable-Length-Coding (VLC), Huffman coding, Arithmetic coding, Run-Length-Encoding (RLC) and similar. The entropy modification executed within the first entropy 10 is reversible and beneficially lossless, mutatis mutandis also in the second entropy modifier 60. Moreover, the entropy modification executed within the first entropy modifier 10 at least stores a new data element containing a continuous amount of similar bits after every change of bit value.

When executing entropy reduction as aforementioned, there has to be provided an indication of a first bit in any given sequence. Moreover, there also has to be provided an escape code that enables a limited number of codes to be employed for representing data elements, namely a maximum run, when the data elements are to be compressed. Optionally, the escape code is represented by digit "0"; the escape code denotes a highest value that the data element can represent, namely a maximum run, and it additionally conveys information that the bit value is continued. Beneficially, when implementing embodiments of the present invention, one or more codes corresponding to a maximum run of bits are varied, depending upon the data and its properties; in other words, the one or more codes corresponding to the maximum run are adaptively varied depending upon the data to be compressed. Optionally, the entropy modifiers 10, 60 utilize pre- and/or post-processing methods, for example an ODelta operator, that operates for 1-bit data. However, for the entropy modifiers 10, 60, data being processed therethrough can be of any kind, for example image data, video data, audio data, reference data, masks, split bits, sign bits, and compressed data, namely any sort of data that can be processed in bits. Optionally, bytes or words of any data can be inserted into a stream that includes bits, and can be processed through the entropy modifiers 10, 60. In the following, "entropy modifier" and "inverse entropy modifier" will be abbreviated to EM, IEM respectfully, namely for use in providing data compression and data decompression respectively, namely executed via the first and second entropy modifiers 10, 60 respectfully.

The entropy modifiers 10, 60 optionally are implemented using computing hardware (CPU) 70 which is operable to execute one or more software products 80 recorded on machine-readable data storage media 90 for implementing methods pursuant to the present invention.

Embodiments of the present invention will now be described in greater detail. The entropy modifiers 10, 60 employ one parameter that defines a maximum run number of 0's or 1's for example present in a stream of data bits. Moreover, entropy modifiers 10, 60 also employ an escape element that is used when the run of bits in the bit stream is larger than the maximum run in the bit stream. Beneficially, the maximum run length L is set to one or more in a series:

$$L=2^n-1 \qquad \text{Eq. 2}$$

wherein n is an integer with values n=2, 3, . . . .

This corresponds to a series L=3, 7, 15, 31, . . . , but is beneficially any number greater than 1. Beneficially, the escape element is chosen to be a value "0", because a plurality of zero similar bits is not possible when implementing the invention. It will be appreciated that if the number of similar bits is decreased by one count as above, then the escape element is beneficially the maximum run. The entropy modifier 10 requires, when compression of a stream of bits is desired, for a first bit in the stream to be known, so that the corresponding compressed bit stream can be subsequently decoded, namely decompressed, reversibly in the entropy modifier 60.

For further elucidating embodiments of the present invention, an example will now be described. Below is presented a first example of a manner in which entropy encoding pursuant to the present invention functions in a case where the maximum run length is 3 bits and the escape code is "0":
An original stream of bits is as follows:
0 1 1 0 0 1 1 1 1 1 1 1 0 0 0 0 1 0 0 0 1 1 1 1 1 1
which includes twenty six bits in total in the stream, of which there are sixteen "1's" and ten "0's".

The entropy E associated with this original stream of bits is calculable as follows:

$$E = 16 * \log_{10}\left(\frac{26}{16}\right) + 10 * \log_{10}\left(\frac{26}{10}\right) = 7.52339 \quad \text{Eq. 3}$$

From Equation 3 (Eq. 3), the minimum number of bits $M_B$ that are needed for encoding the original stream of bits having such an associated entropy E is calculable pursuant to a source coding theorem as follows:

$$M_B = \frac{E}{\log_{10}(2)} = 24.99125 \text{ bits} \quad \text{Eq. 4}$$

The aforementioned original stream of bits is encodable by applying a method pursuant to the present invention to generate a corresponding sequence of codes:
The first bit value is "0" and the continuous amount of similar bits (=entropy modified symbols) are:
1 2 2 7 4 1 3 6
When the escape symbol "0" is used for limiting the number of different symbols to 4 different values from 0 (escape) to 3 (maximum run length), and also the first bit value has been added as the first symbol to the stream, we thereby will get:
0 1 2 2 0 0 1 0 1 1 3 0 3
which includes thirteen codes in total in the stream, of which there are five "0's", four "1's", two "2's" and two "3's".

The entropy E associated with this stream of codes is calculable as follows:

$$E = 5 * \log_{10}\left(\frac{13}{5}\right) + 4 *\left(\frac{13}{4}\right) + 2 * 2 * \log_{10}\left(\frac{13}{2}\right) = 7.37405 \quad \text{Eq. 5}$$

from which the minimum number of bits $M_B$ to represent such entropy E in a lossless manner is calculable as follows:

$$M_B = \frac{E}{\log_{10}(2)} = 24.49608 \text{ bits} \quad \text{Eq. 6}$$

It will be appreciated from this example that entropy in the series of codes is less than the original stream of bits, and that fewer bits are required to represent the series of codes. Optionally, entropy-modified series of codes are generated as outlined in Table 1:

TABLE 1 inverse of entropy-modified codes

| Code | Designation |
|---|---|
| 0 | First bit value |
| 1 | Number of first bits: one "0" |
| 2 | Number of bits after change: two "1's" |

TABLE 1-continued inverse of entropy-modified codes

| Code | Designation |
|---|---|
| 2 | Number of bits after change: two "0's" |
| 0 | Escape code representative of four or more mutually similar bits, for example three "1's" |
| 0 | Escape code representative of four or more mutually similar bits, for example three "1's" |
| 1 | Number of bits after change, (7)-2*(escape bits), wherein there are three escape bits, namely one "1" |
| 0 | Escape code representative of four or more mutually similar bits, for example three "0's" |
| 1 | Number of bits after change, (4)-1*(escape bits), wherein there are three escape bits, namely one "0" |
| 1 | Number of bits after change: one "1" |
| 3 | Number of bits after change: three "0's" |
| 0 | Escape code representative of four of more mutually similar bits, namely three "1's" |
| 3 | Number of bits after change (6)-1*(escape bits), wherein there are three escape bits, namely three "1's" |

Table 1 is merely an example, and implementation of embodiments of the present invention is able to generate many alternative examples. For example, other maximum run values and other escape codes can be employed. Moreover, the first bit is optionally inserted separately, and it does not then influence the actual codes employed and their associated compression to any significant extent.

Optionally, the entropy modifiers 10, 60 are operable, in certain circumstances, to increase entropy, and it is therefore beneficial for output data from the entropy modifiers 10, 60 to be monitored, for example using a signal monitoring arrangement, to determine whether or not an adopted coding regime provides a desired degree of data compression. In an event that entropy is increased for a given type of data to be communicated, the signal monitoring arrangement can be employed to control operation of the entropy modifiers 10, 60 in an adaptive manner to ensure that a desired modification in entropy therethrough is achieved in operation. For example, for a given type of data, it is desirable that the entropy modifier 10 be used to apply one or more test encoding regimes when commencing encoding of a data stream in order to search for an optimal value of maximum run to employ for obtaining optimal data compression; the maximum run can have a major impact on entropy E. Additionally, the entropy E associated of the first bit value in a given data stream has a major impact on the entropy E when the length of given data stream is relatively short; for example, the first bit value is beneficially transmitted separately from other code words used to represent the given data stream.

As illustrated in FIG. 1, it is beneficial that the entropy modifiers 10, 60 be employed in combination with entropy coding methods such as Variable-Length-Coding (VLC), Huffman coding, Run-Length-Encoding (RLE) and Arithmetic coding. Alternatively, other types of entropy modifiers such as Delta coding are beneficially employed in combination therewith. Such entropy coding methods are beneficially employed after the entropy modifier 10, and before the entropy modifier 60; alternatively, or additionally, such entropy coding methods are beneficially employed before the entropy modifier 10, and after the entropy modifier 60; for example, in an event that original data to be encoded is alphanumeric, numbers, bytes or words, the original data is coded efficiently with additional coding as provided in Table 2:

TABLE 2 additional coding employable with an entropy modifier pursuant to the present invention

| Additional encoding method | Situation of use |
| --- | --- |
| RLE | When the given data stream includes continuous streams of same data values |
| Delta | When the given data stream includes data values that are similar or mutually substantially similar or changes similarly |
| VLC/Huffman/Arithmetic | When the given data stream includes many mutually similar data values |

Optionally, the entropy modifiers 10, 60 are employed in a recursive manner.

As aforementioned, entropy modifiers pursuant to the present invention are beneficially employed in conjunction with other types of entropy modifiers, wherein the other types of entropy modifiers are optionally known types. Known types include Delta coding for example. Typically, Delta coding is employed for processing numerical values that are provided in a format of bytes or words. An example of the entropy modifier of the invention employed in combination with Delta coding will next be described.

For further elucidating the present invention, two examples will be described, one example without use of an entropy modifier pursuant to the present invention and the other utilizing an entropy modifier pursuant to the present invention. In the example, a maximum run length of 7 bits is employed with an associated escape code being "0". When employing a 1-bit ODelta-type operator, a first bit in an encoded sequence is the same as a corresponding original data bit present in an original data stream to be encoded. Optionally, the 1-bit ODelta operation can be run recursively.

Example 1

In an original stream of data bits, there are included thirty seven bits in total, namely seventeen "1's" and twenty "0's":
0 1 0 1 0 1 1 0 0 1 0 0 0 1 0 1 0 0 0 0 0 0 0 0 0 0 0 1 1 1 1 1 1 1 1 1 1
wherein a corresponding associated entropy E is calculable as follows:

$$E = 17 * \log_{10}\left(\frac{37}{17}\right) + 20 * \log_{10}\left(\frac{37}{20}\right) = 11.08523 \qquad \text{Eq. 7}$$

corresponding to 36.82 bits for computed $M_B$, namely substantially 37 bits as provided above. It will be appreciated that Equation 7 (Eq. 7) corresponds to the amount of bits in the original bit stream.

An equivalent entropy modified (EM) code is as follows, in a generally similar manner to that employed to generate Table 1:
0 1 1 1 1 1 2 2 1 3 1 1 1 0 4 0 3
wherein an associated entropy E is calculable as follows:

$$E = 3 * \log_{10}\left(\frac{17}{3}\right) + 9 * \log_{10}\left(\frac{17}{9}\right) +$$
$$2 * 2 * \log_{10}\left(\frac{17}{2}\right) + 1 * \log_{10}\left(\frac{17}{1}\right) = 9.69397 \qquad \text{Eq. 8}$$

It will be appreciated that Equation 8 (Eq. 8) corresponds to the amount of bits after the entropy modification. Moreover, it will be appreciated that this amount of bits is less than that associated with Equation 7 (Eq. 7).

However, when the original stream of bits above is subject to an ODelta operation, a corresponding modified stream of bits is generated which includes thirty seven bits, in which there are thirteen "1's" and twenty four "0's":
0 1 1 1 1 1 0 1 0 1 1 0 0 1 1 1 1 0 0 0 0 0 0 0 0 0 0 1 0 0 0 0 0 0 0 0 0
wherein a corresponding entropy E is calculable as follows:

$$E = 13 * \log_{10}\left(\frac{37}{13}\right) + 24 * \log_{10}\left(\frac{37}{24}\right) = 10.41713 \qquad \text{Eq. 9}$$

namely smaller than the entropy E associated with the original stream of bits (Eg. 7). When this ODelta-processed stream of data bits above is subject to entropy modification pursuant to the present invention, there is thereby obtained a corresponding encoded sequence of codes such as:
0 1 5 1 1 1 2 2 4 0 3 1 0 2
wherein a corresponding entropy E is calculable as follows:

$$E = 2 * 3 * \log_{10}\left(\frac{14}{3}\right) + 5 * \log_{10}\left(\frac{14}{5}\right) + 3 * 1 * \log_{10}\left(\frac{14}{1}\right) = 9.68822 \qquad \text{Eq. 10}$$

which is less than the entropy E of the original stream (Eq. 7) of data bits including 37 bits in total. Moreover, it will be appreciated that this amount of bits is less than that associated with Equation 8 (Eq. 8) or Equation 9 (Eq. 9).

This example illustrates that it is possible to compress the original stream of data bits efficiently when the original stream of data is firstly compressed using a 1-bit ODelta operator and then with an entropy modifier pursuant to the present invention.

Example 2

The aforesaid original bit stream in Example 1 is divided into two parts, and benefits of entropy modifying pursuant to the present invention are optimized by selecting a best combination of these two resulting streams of data. The value of first bit of the entropy modifier is transmitted separately and is not inserted into a resulting entropy-reduced series of codes. A first entropy modification result obtainable is similar to Example 1, wherein the first bit is also set as a "1" code word. A similar maximum run of seven bits is employed, and "0" is employed for the escape code, as provided in Table 3:

TABLE 3

Example 2 entropy modification

| | Bit stream | Entropy, E | Maximum bits to encode, $M_B$ |
| --- | --- | --- | --- |
| Original bits part 1 (16 bits. with seven "1's" and none "0's"): | 0 1 0 1 0 1 1 0 0 1 0 0 0 1 0 1 | 4.7621 | 15.82 bits |
| Entropy modified (EM) | 0 1 1 1 1 1 2 2 1 3 1 1 1 | 5.2910 | 17.58 bits |
| Entropy modified (EM) | (0) 1 1 1 1 1 1 2 2 1 3 1 1 1 1 | 3.7599 | 13.49 bits |
| ODelta modified | 0 1 1 1 1 1 1 0 1 0 1 1 0 0 1 1 1 | 4.3158 | 14.34 bits |

TABLE 3-continued

Example 2 entropy modification

| Bit stream | | Entropy, E | Maximum bits to encode, $M_B$ |
|---|---|---|---|
| EM | (0) 1 5 1 1 1 2 2 3 | 4.2144 | 15.00 bits |
| Original bits part 2 (21 bits, with eleven "1's" and ten "0's"): | 0 0 0 0 0 0 0 0 0 0 0 1 1 1 1 1 1 1 1 1 1 | 6.3113 | 20.97 bits |
| Entropy modified (EM) | (0) 0 4 0 3 | 1.08062 | 6.00/7.00 bits |
| ODelta | 0 0 0 0 0 0 0 0 0 0 0 1 0 0 0 0 0 0 0 0 0 | 1.7460 | 5.80 bits |
| EM | (0) 0 4 1 0 2 | 2.8928 | 9.61/10.61 bits |

From Table 3, it will be appreciated that a decrease in entropy is achieved, which is beneficially when data compression is to be achieved. A best compression of data is achieved when the first part stream of data is entropy coded from data that is generated from the original stream of data which is entropy-modified, namely is represented using 13.49 bits, and the second part is entropy-modified via 1-bit ODelta coding, namely is represented using 5.80 bits, to be expressible using 19.29 bits compared to original 37 bits being required; this represents a considerable compression of data. When the second data stream is coded, there is no need to send the value of the first bit because it can be known based on the first data stream. For that reason, there are two different values shown in the Table 3, partitioned by "/"; the first for continuation situation (i.e. value of first bit not sent) and the second for the case where the data stream starts with this kind of bits combination. It will be appreciated that although, in this example, the ODelta coding alone reduces the entropy of data, namely mostly for the second part of the data, it does provide beneficial entropy reduction also in combination with the entropy modifiers 10, 60. Here entropy-modified original data causes a smaller entropy than entropy-modified data that is first processed with ODelta coding, namely 6.00 bits<9.61 bits. In a practical coding solution, entropy-modified original data is optionally beneficially compressed more efficiently than the ODelta coded data, although the entropy of the latter one is smaller, namely 5.80 bits<6.00 bits; 1-bit data is not so practical for implementations of entropy encoders, although Arithmetic coding, amongst others, is beneficially employed also for compressing 1-bit data. Optionally, the original stream of bits is split into more than two parts, prior to being subject to entropy modification processes for achieving data compression.

Optionally, splitting of the original stream of data bits to one or more streams, namely parts, can be executed automatically by a method including:
(a) analyzing an entropy associated with the original stream of data bits;
(b) splitting the original stream of data into two or more parts, depending upon a function of the analyzed entropy of the original stream of data bits;
(c) applying one of more entropy modifying operations to the two or more parts to generate one or more corresponding entropy-modified parts; and
(d) combining the one or more entropy-modified parts together to generate compressed encoded output data.

The present invention is also concerned with a method of decoding the encoded output data, wherein an inverse of steps (a) to (d) are utilized. Optionally, the method includes splitting or combining data blocks present in the original stream of bits so that encoding is implemented more efficiently, for example for achieving an enhanced compression ratio and/or achieving substantially lossless compression.

Optionally, step (b) is implemented in a coarse manner, namely just dividing up the original stream of data bits when multiple long run sections are encountered in the original stream of data bits, namely after or between regions of the original stream of data bits where there is a big enough region of the stream of data bits where the data bits vary sequentially in a rapid manner.

Optionally, to generate an encoded bit stream pursuant to the present invention, an original stream of data bits is processed to provide intermediate encoded data, for example via application of VLC, Arithmetic coding and/or RLE, which is then subjected to entropy modification pursuant to the present invention to generate output encoded data which is compressed and reduced in entropy; such as approach is illustrated in FIG. 1. Considerable speed optimization during data compression is thereby achieved, which corresponds to less computing power being necessary when the present invention is implemented by way of one or more software products recorded on machine-readable data storage media, wherein the one or more software products are executable upon computing hardware for implementing an entropy-modifying encoder, mutatis mutandis entropy-modifying decoder. Optionally, entropy optimizations are implemented such that an original bit, alphabetic, number, byte, word in the original steam of data bits is first coded using some other method, and after that, entropy modification pursuant to the present invention applied to generate encoded output data.

In contemporary known run-length encoding (RLE) methods, there is generated a given value, and then thereafter corresponding data indicative of the number of occurrences of this given value, before it is followed by another subsequent value. Such an RLE method is continued as long as input data to be encoded is available, namely one value after another is encoded in sequence. In contradistinction, the present invention derives from an observation that, if only 1-bit values are employed, there is no need to add "0" and "1" data values into a stream of data to be encoded, because they occur alternately in turn; thus, it is sufficient that only the first value in a given sequence be expressed in a transmission of encoded data. Thus, the present invention is akin to RLE coding but employs a 1-bit data stream as aforementioned.

When implementing embodiments of the present invention, the escape code is an addition that enables more efficient usage of practical encoding methods to be employed. Beneficially, embodiments of the present invention include sending one or more coding tables from an encoder to a corresponding decoder to assist with decoding of encoded data sent from the encoder and received at the decoder.

Escape codes which are employed for implementing embodiments of the present invention are susceptible to being implemented in several different ways. For example, in a case of a run-length symbol or digit that continues with a "0" value, satisfactory encoding is achievable. However, situations potentially arise where these amount values are small, while conversely, occasionally, very large values may occur; in these situations, the escape code is beneficially set to a next value that is not yet used, or allocated for use as a code word. For example, if a maximum run-length employed is seven bits or elements, and the escape code is "0", then a code word "8" is used during generation of an encoded data stream; this new escape code only adds one new code word, and after this, the actual number of symbols is expressible using any method, for example in 1, 2 and/or 3 bytes, or using half-bytes (i.e. "nibbles"). Optionally, the actual number of symbols is transmitted without being compressed. Optionally, the actual number of symbols is combined with the maximum run-length value and then compressed together with other data values in an entropy compressor, namely entropy modifier.

When selecting a suitable escape value for use in embodiments of the present invention, it is advantageous to express at once a total number of adjacent elements, and therefore, after invoking this escape value, the same bit is not continued subsequently in contradistinction to use of an escape value. Such a new form of termination provides an escape, namely code word, that is useable in addition to a continuous escape method as aforementioned; alternatively, such a new escape code is useable as an only alternative, and, in such case, its code word is beneficially settable to a value "0". Similarly, if a given data value of this terminating code is often small, but occasionally large, it is beneficial to express the number of consecutive similar symbols present in data with an alternating number of bytes or nibbles. One bit of such a byte, for example a least significant bit (LSB) or most significant bit (MSB) is beneficially reserved to indicate the termination of the number, for example bit string, and thus beneficially its code word is set to a value "0" or "1" in a case where the value ends, in other cases, the value continues.

In order to elucidate the foregoing, an example of functionality of an escape code will next be described in a situation wherein both types of escape are utilized. In the example, a maximum run of 14 elements is employed, with a code word for a continuous escape being denoted by 15, wherein a code word for a terminating escape is 0. Moreover, values for the amounts of consecutive similar symbols or bits are:
9, 1024, 16, 9, 12, 2000, 7, 20, 21, 6, 8, 120, 12, . . . .

Furthermore, the example utilizes half-bytes (i.e. nibbles) of which a most significant bit (MSB) of value "1" is employed to indicate the termination of the number, namely bit string. Beneficially, if the terminating escape is employed, it is feasible to subtract from the number, namely the bit stream, the following:
(bit string)−(MAXRUN+1)
For example:
$1024_{base\ 10} =>$
$1024_{base\ 10} - (14_{base\ 10} + 1) => 1009_{base\ 10} => 1\ 111\ 110\ 001_{base\ 10\ number\ expressed\ for\ nibbles} =>$
1+8(Terminates) 7 6 1). Thus, the example can be coded as:
9 0 1 6 7 9 1 5 2 9 1 2 0 1 0 7 1 1 7 1 5 6 1 5 7 6 8 0 1 5 9 1 2.

In this example, the entropy modifiers 10, 60 need to be able to interpret code words having values in a range 0 to 15. It is feasible to express this example by using merely a single escape code, wherein a code word "0" corresponds to an escape code that also indicates a terminating escape; in such an alternative example of a single type of escape code, the continuous escape is not used, and the other parameters are as above, namely:
9 0 1 6 7 9 0 9 9 12 0 1 0 7 11 7 0 13 0 14 6 8 0 1 5 9 12,
wherein the entropy modifiers 10, 60 are required to recognize code words in a range of 0 to 14. This alternative example is optionally expressed by using only the continuous escape expressed by a code word "0" and employing a maximum run length of 14, resulting in a following form of sequence of codes:
9 73x0 2 0 2 9 12 142x0 12 7 0 67 6 8 8x0 8 12.

The best coding solution can be selected based on the Entropy that is calculated for all the three solutions separately.

Embodiments of the present invention for providing entropy modification (EM) and inverse entropy modification (IEM) will next be described. However, other embodiments are also feasible within the scope of the present invention, for example corresponding entropy modifiers based upon digital hardware, for example variable-state-machines, ASIC's and similar. "GetBit", "SetBit" and "ClearBit" instructions in the following examples function always to update "HeaderBits" values. Moreover, a "HeaderIndex" value is also updated when a next bit will be in a next byte. In the following examples, which are software-product based, the first bit is stored as one code. Optionally, in better implementations, the first bit value is separated from the codes as aforementioned, for example with reference to Table 3. A corresponding decoder is beneficially optimized by writing multiple bits together to a destination byte contributing to decoded output data. It will be appreciated that "MaxRun" provided in following example embodiments is similar to (maximum run length+1); for example, when a maximum run length of 7 bits is employed, a value of 8 is given as function parameter "AMaxRun" in the following embodiments.

```
function EncoldeBitRLE1u(APtrSrc : PByte: ASrcBltLen :
Cardinal: APtrDst : PByte: var ADstBitOffset : Cardinal: AMaxRun :
Cardinal) : Boolean:
var
    |HeaderIndex, |HeaderBits, |RunLength, |Index : Cardinal;
    bBit. bLestBit : Boolean;
begin
    // Reset offsets
    ADstBitOffset : = 0;
    |HeaderIndex : = 0;
    |HeaderBits : = 0;
    // Read first bit, write it to destination and initialize run
    bLastBit : = GetBit(APtrSrc, @|HeaderIndex, @|HeaderBits);
    APtrDst[(ADsBitOffset + 7) div 8] : = Byte(bLastBit);
    Inc(ADstBitOffset, 8);
    |RunLength := 1;
    // Go through bits
    for |Index := 1 to AsrcBitLen -1 do
    begin
        // Read bit
        bBit := GetBit(APtrSrc, @|HeaderIndex, @|HeaderBits);
        // Same bit as previous
        if (bBit = bLastBit) then
        begin
            // Increment run of bits
            Inc(|RunLength, 1);
            // Escape (same bits continuous over maximum run)
            if(|RunLength = AMaxRun) then
            begin
                // Write escape code to destination and initialize run
                APtrDst[ADstBitOffset + 7) div 8] := 0;
                Inc(ADstBitOffset, 8);
                |RunLength := 1;
            end
        end
        // Different bit as previous
            else
            begin
                // Change bit write run of bits to destination and initialize run
                bLastBit := bBit;
                APtrDst[(ADsBitOffset + 7) div 8] := |RunLength;
                Inc(ADstBitOffset, 8);
                |RunLength := 1;
            end;
        end;
    //Write last bits
    APtrDst[(ADsBitOffset + 7) div 8] := |RunLength;
    Inc(ADstBitOffset, 8);
    end;
function DecodeBitRLE1u(APtrSrc : PByte; ASrcBitOffset :
Cardinal; APtrDst : PByte; var ADstBitLen : Cardinal; AMaxRun :
Cardinal) : Boolean;
    var
        bBit : Boolean;
        Value : Byte;
        |SrcBitOffset, |Index, |RunLength, |HeaderIndex, |HeaderBits,
|DstBitOffset : Cardinal;
    begin
        // Reset srcbitoffset, dstbitoffset and clear first destination byte
```

```
    |SrcBitOffset := 0;
    |DstBitOffset := 0;
    |HeaderIndex := 0;
    |HeaderBits := 0;
    APtrDst[0] := 0;
    // Read first bit value (= byte) and update srcbitoffset
    bBit := (APtrSrc[(|SrcBitOffset + 7) div 8] > 0);
    Inc(|SrcBitOffset, 8);
    // Go through all Bytes until source is finished or destination buffer
is full while (((|SrcBitOffset < ASrcBitOffset) and (|DstBitOffset <
ADstBitLen)) do
    begin
        // Read runlength and update srcbitoffset
        |RunLength := APtrSrc[(|SrcBitOffset + 7) div 8];
        Inc(|SrcBitOffset, 8);
        // Process escape code
        if (|RunLength = 0) then
        begin
        // Set bits for escape
        for |Index := 1 to AMaxRun - 1 do
        begin
            // Set bit if destination buffer is not full
            if (|DstBitOffset < ADstBitLen) then
            begin
                // Set bit and/or go to next bit
                if (bBit) then
                    SetBit(APtrDst, @|HeaderIndex, @|HeaderBits)
                else ClearBit(APtrDst, @|HeaderIndex, @|HeaderBits);
                Inc(|DstBitOffset, 1);
            end;
        end;
    end
    // Process runlength
    else
    begin
        // Set bits for run
        for |Index := 0 to |RunLength - 1 do
        begin
            // Set bit if destination buffer is not full
            if (|DstBitOffset < ADstBitLen) then
            begin
                // Set bit and/or go to next bit
                if (bBit) then
                    SetBit(APtrDst, @|HeaderIndex, @|HeaderBits)
                else ClearBit(APtrDst, @|HeaderIndex, @|HeaderBits);
                Inc(|DstBitOffset, 1);
            end;
        end;
        // Change bit value
        if (bBit) then
            bBit := False
        else bBit := True;
    end;
end;
```

Even though it is not possible for an entropy coding method, for example VLC, Huffman coding, Arithmetic coding, RLE coding and so forth, to compress data to a smaller size than its entropy allows, namely without using some form of prediction or other additional information, namely without loss of information occurring, this does not mean in all cases that a greatest compression of data in practice corresponds to a smallest entropy; in other words, in practice, entropy and data compression are not exactly identical concepts. Decoding encoded data back to its corresponding original form always demands some additional information, the transmission of which sometimes demands an unreasonable amount of extra information in addition to actual data to be compressed. When large quantities of data are to be handled, a smallest entropy usually corresponds to a best data compression, but when small amounts of data are to be handled, compressing the data is not always so straightforward; for example, 1-bit data is usually difficult to compress efficiently, and therefore, the entropy modifiers 10, 60 that is operable to process 1-bit information is potentially, commercially, a very valuable invention. Moreover, processing data in a format which is more easily compressible often results in a reduction in entropy of the formatted data in comparison to corresponding original data prior to formatting processes being applied.

As aforementioned, it is often efficient if a first bit value in a sequence of code words representing encoded data is transmitted separately from those values that indicate the number of consecutive symbols or bits. However, such separate transmission does not need to correspond to a completely separate communication. In the following examples, despite the separate handling of the first bit, there is still a need to add the amount of the first bit to the total amount of the successive elements, because it would otherwise not be possible to distinguish between the following examples:

0 0 1 and 0 1 or
1 1 0 and 1 0, without setting the first element amount number to zero, which is not desirable if it is to be employed for implemented the aforementioned escape code, namely for use when the number of consecutive similar signals exceeds the maximum run length in the examples.

In FIG. 1, the size of the data D2 is not necessarily smaller than the size of the data D1, but its entropy is smaller, even though the data D1 and D2 include mutually similar information. The size of the data D2 is dependent run-lengths employed. For example, in the data D1, the size of data elements is 1 bit, whereas the size of the data D2 depends on the size of run length employed. For example, if the data D1 has a size of 104 bits, and an entropy E=80, the data D1 can be converted by the entropy modifier 10 by using a maximum run-length of 7 elements in the data D2, which has 40 elements, namely 3-bit elements having a value in a range of 0 to 7, and an entropy E=50, then the data D2 has a size 40*3 bits=120 bits; in such an example, the data D2 is larger in size than the data D1. The encoding stage 20 beneficially employs VLC transformations which is able to compress the data D2 into 52 bits to provide the data D3. Thus, it is to be appreciated that the entropy modifiers 10, 60 do not always provide data compression and decompression respectively, but are capable of providing data compression and decompression when employed with other encoding stages.

Embodiments of the present invention are beneficially included as component parts of communication systems, audio-visual consumer products, scientific image-processing equipment, computing devices, wireless-enabled communication devices such as smart phones, digital cameras, digital surveillance equipment, interactive computer games, to mention a few examples. Increased data compression is capable of reducing data storage requirements, saving energy and enables faster communication to be achieved, all of which would be regarded as beneficial technical effects employable in industry, for example. Moreover, the embodiments are implementable in software products, hardware, or any combination thereof. The software products are optionally downloadable as software applications, namely "software apps".

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

I claim:

1. An entropy modifier which is operable to encode a stream of input data bits (D1) having a first entropy for generating corresponding entropy-modified output data (D2) having a second entropy, wherein the entropy modifier is operable to process the stream of input data bits (D1) to handle groups of mutually similar bits and the value of the first bit, and one or more maximum run lengths of the groups of mutually similar bits.

2. The entropy modifier as claimed in claim 1, wherein the entropy modifier is operable to control one or more maximum run lengths of the groups of mutually similar bits by using at least one escape code.

3. The entropy modifier as claimed in claim 2, wherein the one or more maximum run lengths of the groups of mutually similar bits are controlled by a plurality of escape codes.

4. The entropy modifier as claimed in claim 2, wherein the at least one escape code is implemented as a "0" value within the entropy modifier.

5. The entropy modifier as claimed in claim 1, wherein the entropy modifier is operable to handle the input stream of data (D1) using the maximum run length in manner which is dynamically varied as a function of a nature of the stream of input data (D1).

6. The entropy modifier as claimed in claim 1, wherein the entropy modifier (10) is operable to handle a value of a first bit in the stream of input data (D1) separately from a sequence of data bits.

7. The entropy modifier as claimed in claim 6, wherein the entropy modifier is operable to handle the value of the first bit as separately encoded relative to the sequence of data values that represent a continuous amount of similar bits.

8. The entropy modifier as claimed in claim 1, wherein the entropy modifier is utilized in conjunction with one or more coding arrangements for handling the stream of input data bits (D1), wherein the one more coding arrangements include one or more of: ODelta coder, RLE coding, VLC coding, Huffman coding, Delta coding, Arithmetic coding.

9. The entropy modifier as claimed in claim 1, wherein the entropy modifier is operable to handle the stream of input data bits (D01) in a plurality of parts which are separately encoded or decoded.

10. The entropy modifier as claimed in claim 9, wherein the entropy modifier is operable to handle the plurality of parts in a temporally parallel manner, namely by way of parallel execution.

11. The entropy modifier as claimed in claim 9, wherein the entropy modifier is operable to handle the plurality of parts by using maximum run lengths which are mutually different for one or more of the parts.

12. The entropy modifier as claimed in claim 1, wherein the entropy modifier is implemented to function as an encoder for compressing the stream of input data (D1) to generate the entropy-modified output (D2, D3).

13. The entropy modifier as claimed in claim 1, wherein the entropy modifier (10) is operable to assist to transform a bit string present in the input data (D1) to symbols present in the entropy modified output data (D2).

14. The entropy modifier as claimed in claim 1, wherein the entropy modifier includes computing hardware, wherein the computing hardware is operable to execute one or more software products recorded on machine-readable data storage media for processing the stream of input data (D1) to generate the output data (D2).

15. An entropy modifier which is operable to decode a stream of input data bits (D3 or D4) having a first entropy for generating corresponding entropy-modified output data (D5) having a second entropy, wherein the entropy modifier is operable to process the stream of input data bits (D3 or D4) to handle groups of mutually similar bits and the value of the first bit, and one or more maximum run lengths of the groups of mutually similar bits.

16. The entropy modifier as claimed in claim 15, wherein the entropy modifier is operable to process one or more maximum run lengths of the groups of mutually similar bits by using at least one escape code.

17. The entropy modifier as claimed in claim 16, wherein the one or more maximum run lengths of the groups of mutually similar bits are processed by using a plurality of escape codes.

18. The entropy modifier as claimed in claim 17, wherein the at least one escape code is implemented as a "0" value within the entropy modifier.

19. The entropy modifier as claimed in claim 15, wherein the entropy modifier is operable to handle the input stream of data (D3 or D4) using the maximum run length in manner which is dynamically varied as a function of a nature of the stream of input data (D3 or D4).

20. The entropy modifier as claimed in claim 15, wherein the entropy modifier is operable to handle a value of a first bit in the stream of input data (D3 or D4) separately from a sequence of data bits.

21. The entropy modifier as claimed in claim 20, wherein the entropy modifier is operable to handle the value of the first bit as separately encoded relative to the sequence of data values that represent a continuous amount of similar bits.

22. The entropy modifier as claimed in claims 15, characterized in that the entropy modifier is operable to decode data elements present in the input data (D3 or D4) and apply an inverse entropy modification to generate the output data (D5) as a decoded bit stream.

23. The entropy modifier as claimed in claim 15, wherein the entropy modifier is utilized in conjunction with one or more coding arrangements for handling the stream of input data bits (D3), wherein the one or more coding arrangements include one or more of: ODelta coder, RLE coding, VLC coding, Huffman coding, Delta coding, Arithmetic coding.

24. The entropy modifier as claimed in claim 15, wherein the entropy modifier is operable to handle the stream of input data bits (D3 or D4) in a plurality of parts which are separately encoded or decoded.

25. The entropy modifier as claimed in claim 24, wherein the entropy modifier is operable to handle the plurality of parts in a temporally parallel manner, namely by way of parallel execution.

26. The entropy modifier as claimed in claim 24, wherein the entropy modifier is operable to handle the plurality of parts by using maximum run lengths which are mutually different for one or more of the parts.

27. The entropy modifier as claimed in claim 15, wherein the entropy modifier is implemented to function as a decoder for decompressing the stream of input data (D3 or D4) to generate the entropy-modified output (D5).

28. The entropy modifier as claimed in claim 15, wherein the entropy modifier is operable to assist to transform symbols present in the input data (D3 or D4) to a bit string present in the output data (D05).

29. The entropy modifier as claimed in claim 15, wherein the entropy modifier includes computing hardware, wherein the computing hardware is operable to execute one or more software products recorded on machine-readable data storage media for processing the stream of input data (D3 or D4) to generate the output data (D5).

30. A method of using an entropy modifier to encode a stream of input data bits (D1) having a first entropy for generating corresponding entropy-modified output data (D2) having a second entropy, wherein the method includes:
using the entropy modifier to process the stream of input data bits (D1) to handle groups of mutually similar bits and the value of the first bit, and one or more maximum run lengths of the groups of mutually similar bits.

31. The method as claimed in claim 30, wherein the method includes using the entropy modifier to control one or more maximum run lengths of the groups of mutually similar bits by using at least one escape code.

32. The method as claimed in claim 31, wherein the at least one escape code is implemented as a "0" value within the entropy modifier.

33. The method as claimed in claim 30, wherein the method includes using a plurality of escape codes to control the one or more maximum run lengths of the groups of mutually similar bits.

34. The method as claimed in claim 30, wherein the method includes using the entropy modifier to handle the input stream of data (D1) using the maximum run length in manner which is dynamically varied as a function of a nature of the stream of input data (D1).

35. The method as claimed in claim 30, wherein the method includes using the entropy modifier to handle a value of a first bit in the stream of input data (D1) separately from a sequence of data bits.

36. The method as claimed in claim 35, wherein the method includes using the entropy modifier to handle the value of the first bit as separately encoded relative to the sequence of data values that represent a continuous amount of similar bits.

37. The method as claimed in claim 30, wherein the method includes using the entropy modifier in conjunction with one or more coding arrangements for handling the stream of input data bits (D1), wherein the one or more coding arrangements include one or more of: ODelta coder, RLE coding, VLC coding, Huffman coding, Delta coding, Arithmetic coding.

38. The method as claimed in claim 30, wherein the method includes using the entropy modifier to handle the stream of input data bits (D1) in a plurality of parts which are separately encoded or decoded.

39. The method as claimed in claim 38, wherein the method includes using the entropy modifier to handle the plurality of parts in a temporally parallel manner, namely by way of parallel execution.

40. The method as claimed in claim 38, wherein the method includes using the entropy modifier to handle the plurality of parts by using maximum run lengths which are mutually different for one or more of the parts.

41. The method as claimed in claim 30, wherein the method includes implementing the entropy modifier to function as an encoder for compressing the stream of input data (D1) to generate the entropy-modified output (D2, D3).

42. The method as claimed in claim 30, wherein the method includes using the entropy modifier to assist to transform a bit string present in the input data (D1) to symbols present in the entropy modified output data (D2).

43. The method as claimed in claim 30, wherein the method includes implementing the entropy modifier to include computing hardware, wherein the computing hardware is operable to execute one or more software products recorded on machine-readable data storage media for processing the stream of input data (D1) to generate the output data (D2).

44. A computer program product comprising a non-transitory computer readable storage medium having computer readable instructions stored thereon, the computer readable instructions being executable by a computerized device comprising a processor to execute the method as claimed in claim 30.

45. An method of using an entropy modifier to decode a stream of input data bits (D3 or D4) having a first entropy for generating corresponding entropy-modified output data (D5) having a second entropy, wherein the method includes:
Using the entropy modifier to process the stream of input data bits (D3 or D4) to handle groups of mutually similar bits and the value of the first bit, and one or more maximum run lengths of the groups of mutually similar bits.

46. The method as claimed in claim 45, wherein the method includes using the entropy modifier to process one or more maximum run lengths of the groups of mutually similar bits by using at least one escape code.

47. The method as claimed in claim 46, wherein the method includes processing the one or more maximum run lengths of the groups of mutually similar bits by using a plurality of escape codes.

48. The method as claimed in claim 47, wherein the at least one escape code is implemented as a "0" value within the entropy modifier.

49. The method as claimed in claim 45, wherein the method includes using the entropy modifier to handle the input stream of data (D3 or D4) using the maximum run length in manner which is dynamically varied as a function of a nature of the stream of input data (D3 or D4).

50. The method as claimed in claim 45, wherein the method includes using the entropy modifier to handle a value of a first bit in the stream of input data (D3 or D4) separately from a sequence of data bits.

51. The method as claimed in claim 50, wherein the method includes using the entropy modifier to handle the value of the first bit as separately encoded relative to the sequence of data values that represent a continuous amount of similar bits.

52. A method as claimed in claim 45, characterized in that the method includes using the entropy modifier to decode data elements present in the input data (D3 or D4) and apply an inverse entropy modification to generate the output data (D05) as a decoded bit stream.

53. The method as claimed in claim 45, wherein the method includes using the entropy modifier in conjunction with one or more coding arrangements for handling the stream of input data bits (D3), wherein the one or more coding arrangements include one or more of: ODelta coder, RLE coding, VLC coding, Huffman coding, Delta coding, Arithmetic coding.

54. The method as claimed in claim 45, wherein the method includes using the entropy modifier to handle the stream of input data bits (D3 or D4) in a plurality of parts which are separately encoded or decoded.

55. The method as claimed in claim 54, wherein the method includes using the entropy modifier to handle the plurality of parts in a temporally parallel manner, namely by way of parallel execution.

56. The method as claimed in claim 54, wherein the method includes using the entropy modifier to handle the plurality of parts by using maximum run lengths which are mutually different for one or more of the parts.

57. The method as claimed in claim 45, wherein the method includes using the entropy modifier to function as a decoder for decompressing the stream of input data (D3 or D4) to generate the entropy-modified output (D5).

58. The method as claimed in claim 45, wherein the method includes using the entropy modifier to assist to transform symbols present in the input data (D3 or D4) to a bit string present in the output data (D5).

59. The method as claimed in claim 45, wherein the method includes implementing the entropy modifier to computing hardware, wherein the computing hardware is operable to execute one or more software products recorded on machine-readable data storage media for processing the stream of input data (D3 or D4) to generate the output data (D5).

60. A computer program product comprising a non-transitory computer readable storage medium having computer readable instructions stored thereon, the computer readable instructions being executable by a computerized device comprising a processor to execute the method as claimed in claim 45.

* * * * *